(12) United States Patent
Ibanez et al.

(10) Patent No.: US 9,145,704 B2
(45) Date of Patent: Sep. 29, 2015

(54) ANTI-VANDALISM SHIELDED FACILITY FOR THE INJECTION OF INHIBITOR FLUIDS AND OTHER CHEMICALS ASSOCIATED TO PIPELINE TRANSPORT OF HYDROCARBON AND OTHER VALUABLE FLUIDS

(71) Applicant: CORROSION Y PROTECCION INGENIERIA SC, Vista Hermosa (MX)

(72) Inventors: Jorge Joaquin Canto Ibanez, Mexico City (MX); Lorenzo Martinez Martinez De La Escalera, Mexico City (MX); Lorenzo Martinez Gomez, Morelos (MX)

(73) Assignee: CORROSION Y PROTECCIÓN INGENIERÍ S C, Vista Hermosa (MX)

( * ) Notice: Subject to any disclaimer, the term of this patent is extended or adjusted under 35 U.S.C. 154(b) by 0 days.

(21) Appl. No.: 14/182,043

(22) Filed: Feb. 17, 2014

(65) Prior Publication Data
US 2014/0230345 A1    Aug. 21, 2014

(30) Foreign Application Priority Data
Feb. 18, 2013 (MX) .................. MX/A/2013/001908

(51) Int. Cl.
*E04H 9/14* (2006.01)
*E04H 1/12* (2006.01)
*F24J 2/00* (2014.01)
*H01L 31/042* (2014.01)

(52) U.S. Cl.
CPC ............... *E04H 9/14* (2013.01); *E04H 1/1205* (2013.01); *F24J 2/00* (2013.01); *H01L 31/042* (2013.01); *Y02B 10/12* (2013.01)

(58) Field of Classification Search
CPC ...... Y02B 10/12; E04D 13/00; E04H 1/1205; E04H 1/12; E04H 5/02; E04H 1/1238; E04H 5/00; E04H 9/14; H01L 31/042; F24J 2/00
USPC .......................................................... 52/79.1
See application file for complete search history.

(56) References Cited

U.S. PATENT DOCUMENTS

| | | | |
|---|---|---|---|
| 3,868,313 A | | 2/1975 | Gay |
| 3,927,498 A | * | 12/1975 | Benedetti ................ 52/79.1 |
| 3,938,545 A | * | 2/1976 | Nagy et al. ............... 137/363 |
| 4,089,767 A | | 5/1978 | Sabins |
| 4,169,028 A | | 9/1979 | Yokoyama et al. |
| 4,175,021 A | | 11/1979 | Tatum et al. |

(Continued)

FOREIGN PATENT DOCUMENTS

| | | |
|---|---|---|
| BR | 8103399 | 5/2006 |
| ES | 1030934 | 11/1995 |
| ES | 1030935 | 11/1995 |

*Primary Examiner* — Joshua J Michener
*Assistant Examiner* — Matthew Gitlin
(74) *Attorney, Agent, or Firm* — Brooks Kushman P.C.

(57) ABSTRACT

The comprehensive anti-vandalism shielded facility system for injection systems, includes the construction of a security shielded facility, which is a thick and solid structure built with steel rods and reinforced concrete of considerable thicknesses which have as a purpose to prevent access to third-parties that could conduct acts of vandalism. The shielded facility is built with highly resistant concrete that is able to withstand the impact caused by common tools used for acts of vandalism.

6 Claims, 2 Drawing Sheets

(56) References Cited

U.S. PATENT DOCUMENTS

| | | | |
|---|---|---|---|
| 4,275,757 A * | 6/1981 | Singer | 137/363 |
| 4,432,171 A * | 2/1984 | Boot | 52/79.1 |
| 4,504,375 A | 3/1985 | Griffioen | |
| 4,515,669 A | 5/1985 | Dimond et al. | |
| 4,993,450 A * | 2/1991 | Dunn | 137/382 |
| 5,078,171 A * | 1/1992 | Moore et al. | 137/15.08 |
| 5,305,631 A | 4/1994 | Whited et al. | |
| 5,372,578 A * | 12/1994 | Kriesel et al. | 604/8 |
| 6,021,804 A * | 2/2000 | Griffin et al. | 137/341 |
| 6,193,443 B1 | 2/2001 | Trudeau et al. | |
| 6,214,203 B1 | 4/2001 | Horton | |
| 6,247,490 B1 * | 6/2001 | Mosher et al. | 137/363 |
| 6,331,242 B1 | 12/2001 | Horton | |
| 6,438,906 B1 * | 8/2002 | Komarowski et al. | 52/169.1 |
| 6,461,082 B1 | 10/2002 | Smith | |
| 6,532,985 B1 * | 3/2003 | Griffin et al. | 137/341 |
| 6,744,265 B2 | 6/2004 | Yunovich et al. | |
| 7,895,794 B2 * | 3/2011 | Pope | 52/67 |
| 8,186,109 B2 * | 5/2012 | Warminsky | 52/79.1 |
| 8,297,002 B2 * | 10/2012 | Fernandez Fernandez | 52/79.9 |
| 8,776,822 B2 * | 7/2014 | McIntire | 137/199 |
| 8,955,539 B2 * | 2/2015 | Early et al. | 137/363 |
| 8,966,832 B1 * | 3/2015 | Scott, IV | 52/80.1 |
| 2005/0144857 A1 * | 7/2005 | Guerrero | 52/79.1 |
| 2010/0074687 A1 * | 3/2010 | Boudreaux, Jr. | 405/114 |
| 2010/0235206 A1 * | 9/2010 | Miller et al. | 705/7 |
| 2011/0047891 A1 * | 3/2011 | Andretich | 52/79.5 |
| 2011/0214361 A1 * | 9/2011 | Ingjaldsdottir et al. | 52/79.1 |
| 2011/0252718 A1 * | 10/2011 | Kobayashi et al. | 52/79.1 |
| 2011/0289861 A1 * | 12/2011 | Ammons et al. | 52/79.12 |
| 2012/0060902 A1 * | 3/2012 | Drake | 136/251 |
| 2012/0227990 A1 * | 9/2012 | Burnham | 169/48 |
| 2015/0047276 A1 * | 2/2015 | Gandolfo et al. | 52/220.8 |
| 2015/0068616 A1 * | 3/2015 | Early et al. | 137/363 |

* cited by examiner

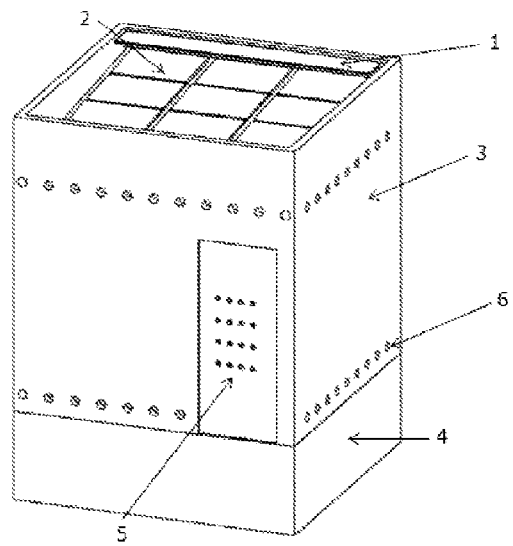
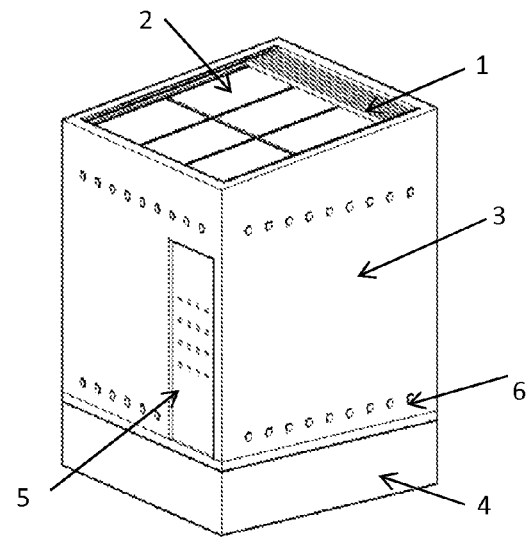
FIGURE 1 A
FIGURE 1 B
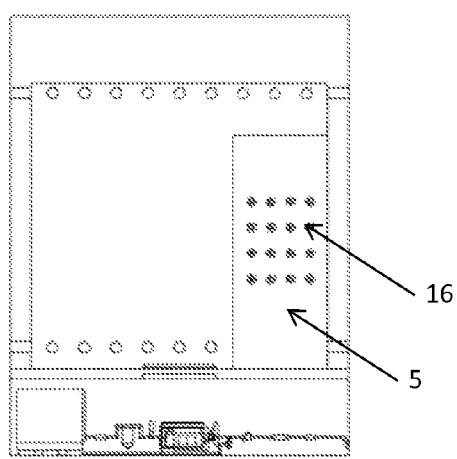
FIGURE 1 C

US 9,145,704 B2

ANTI-VANDALISM SHIELDED FACILITY FOR THE INJECTION OF INHIBITOR FLUIDS AND OTHER CHEMICALS ASSOCIATED TO PIPELINE TRANSPORT OF HYDROCARBON AND OTHER VALUABLE FLUIDS

CROSS-REFERENCE TO RELATED APPLICATIONS

This application claims priority to Mexican Patent Application No. MX/a/2013/001908, filed Feb. 18, 2013 the disclosure of which is incorporated in its entirety by reference herein.

TECHNICAL FIELD

The present invention includes design and construction of a vandalism defense and protection shielded facility for the components of an injection system composed by pump, inhibitor storage tank, and a solar energy source, and also including injection systems for other chemicals associated to pipeline hydrocarbon transport such as surfactants and other flow improvers. The application of the invention is specific for injection systems for inhibitor fluid and other chemicals associated to pipeline hydrocarbon transport located in unpopulated areas or places with high risk of vandalism.

The purpose of the invention is to provide operation, maintenance and security to the injection system for inhibitor fluid and associated chemicals, and other chemicals associated to pipeline hydrocarbon transport, by means of limiting access to authorized personnel only, preventing third parties with vandalism intent from accessing the system.

OBJECTIVE OF THE INVENTION

The main objective of this invention is to protect the elements of a solar powered injection system for inhibitor fluid or other pipeline hydrocarbon transport associated chemicals; by building a shielded facility and a well, using specific acrylic materials and electric shutters for the protection of the solar panels that power the system.

The security system includes the construction of a security bunker, for safekeeping and protection, built with steel rods and reinforced concrete of considerable thicknesses, making it a robust and solid structure.

The hatch that provides access to the inhibitor fluid and other associated chemicals injection system has an unconventional way to open. This hatch was created with the purpose of making it difficult for third-parties with intent of vandalism, to access the system.

BACKGROUND

A corrosion inhibitor fluid can be defined as a product that acts by forming a film over a metal surface or by delivering electrons to the medium. The use of inhibitor fluids is recommended in cases that require better control of the so called interior corrosion on hydrocarbon transport systems. The storage and application of these inhibitors is conducted through the inhibitor fluid injection system.

A chemical injection system generally consists of one or more chemical or inhibitor fluid storage tanks, a mixing container (if needed), a pump and an injection pipe. The storage tanks must be under constant monitoring in order to check content levels, preventing either overflow of the inhibitor fluid or the chemical running out.

These systems may be applied to various processes that range from the oil industry to water treatment. These systems inject large amounts of chemical compounds into these processes. Some of these may be biocides, corrosion inhibitors, methanol, additives, etc. The injection points for the inhibitor fluid must be placed at the origin of the pipeline. This is the reason why many injection systems are located in unpopulated or remote locations, making them easy targets for vandalism.

There are other chemicals that are used in the pipeline hydrocarbon transport industry. Among them are the surfactants, which improve the flow of the hydrocarbon as it circulates the pipeline. These chemicals are introduced using an injection system, therefore they also often become victims of vandalism.

Vandalism problems related to injection systems for inhibitor fluids and other chemicals, have increased in these past years. This is mostly due to the price increase of the materials and components of the injection system, along with poverty and social issues.

This security system resolves the problem above by protecting the inhibitor fluid and other associated chemicals injection system, as well as its solar power source by building a security shielded facility for safekeeping and protection, that houses a reinforced steel structure and highly impact-resistant materials, making it impenetrable by rudimentary tools, turning it completely impregnable; third-party access is automatically restricted by its opening system, as well as by including acrylic materials and electric shutters to protect the solar panels, providing extra protection for the injection system.

Other patents have been found, for example, a watering nozzle anti-vandalism System (ES1030934U, ES1030935U) as well as one for public pay phones (BRMU8103399U); however these inventions cannot be applied to the protection of an inhibitor fluid injection system, given that they are designed for the protection of other specific pieces of equipment. Other patents have been found for protection of cathodic protection systems (U.S. Pat. No. 4,515,669, U.S. Pat. No. 4,504,375, U.S. Pat. No. 6,193,443B1, U.S. Pat. No. 6,461,082, U.S. Pat. No. 4,089,767, U.S. Pat. No. 6,331,242B1, U.S. Pat. No. 6,214,203B1, U.S. Pat. No. 4,175,021, U.S. Pat. No. 6,744,265B2 U.S. Pat. No. 3,868,313, U.S. Pat. No. 4,169,028, U.S. Pat. No. 5,305,631) however, these patents are not applicable to an inhibitor fluid injection system.

Therefore, a review of the literature and intellectual property databases does not reveal the existence of inventions that provide integrated protection for an inhibitor fluid and other chemicals injection system with a solar power source.

BRIEF DESCRIPTION OF THE DRAWINGS

FIGS. 1 A-1 B, are both isometric views of the anti-vandalism shielded facility with all of its components, including: 1) Shutter; 2) Solar panels; 3) Shielded facility; 4) Basement; 5) Access gate; 6) Ventilation shafts.

FIG. 1 C, is a frontal view of the anti-vandalism shielded facility.

DETAILED DESCRIPTION OF THE INVENTION

Figure 2:
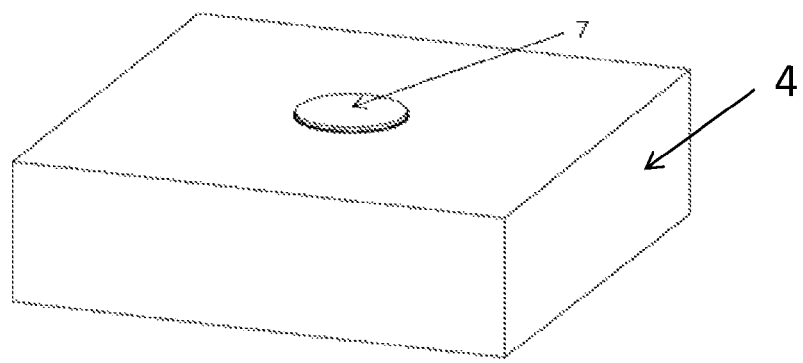
FIGS. 2 A-2 B, are both isometric and frontal views of the lower section of the anti-vandalism shielded facility, where the components of the inhibitor fluid and chemicals associated to the oil industry injection system are located, including: 7) access hatch; 8) Chemical tank; 9) Chemical filter; 10) Calibrator; 11) Pump; 12) Manometer; 13) Gas ventilation pipe; 14) Flow gauge; 15) Injection pipe.
Figure 2:
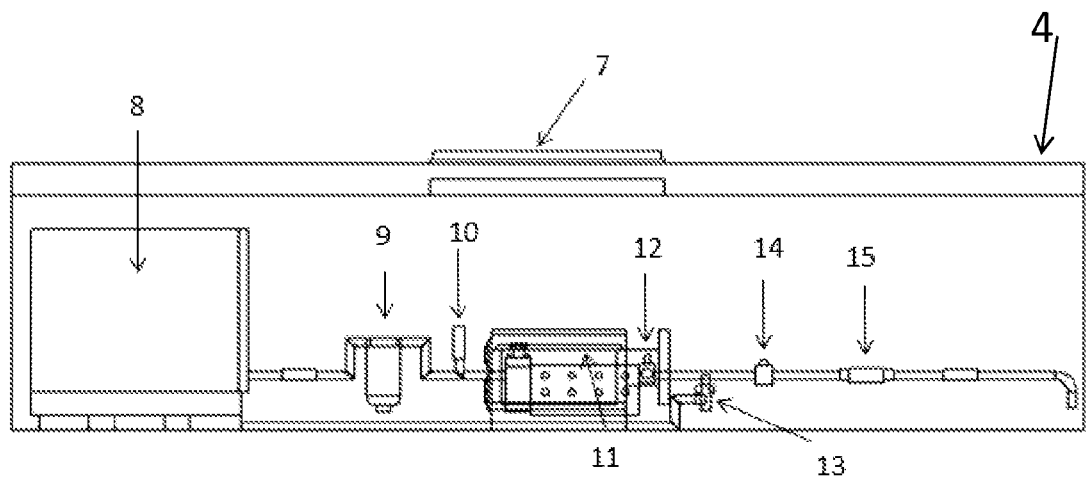

The invention's purpose is to protect an inhibitor fluid injection system (or similar injection system) by the construction of a shielded facility (3) (FIGS. 1A, 1B and 1C), a security well or basement (4) (FIGS. 2A and 2B), including a high impact-resistant steel and reinforced concrete structure that make it resistant to impact of rudimentary tools, that may be used either for vandalism purposes or accidentally. The perpetrators of vandalism activities usually improvise as they proceed with very limited tools such as hammers and bars. Therefore, a height of the shielded facility over 4 m would prevent vandals from climbing up to the solar panel zone. The solar panel sheet covered with dark or gray polymer firmly glued to the shielded facility roof is of choice to discourage theft, as it would imply the destruction of most of the solar sheet material. The invention also includes shock-resistant acrylic panels as well as electric metallic shutters (1) that protect the solar panels (2) that power the entire system.

The roof inclination and slope are determined according the geographical site. The shielded facility (3) is a steel structure made of reinforced concrete having a dual structure of half-inch diameter rods forming a cage, which properly placed, at a height of 2.9 meters max, forming a grid of 20 cm max. With these specifications we guarantee that the structure will be able to withstand rudimentary tools used for vandalism purposes.

The access gate (5) is made of steel and is located at a height about 1.5 m above the ground level. The ladder to reach the gate is portable by the shielded facility operator. The gate (5) opens through a pneumatic system that uses an array of holes (18) that activate the stems of pistons using a combination that will activate from outside, in order to access the shielded facility. The gate must have vertical shaft support on the structure itself on one of the vertical ends, in order to leave only one part showing towards the outside. This helps to prevent weak spots from being found, that may be used to gain access.

The lower section of the shielded facility (FIG. 2) must be at a height of 1.40 m above ground in order to prevent flooding problems. Just like the upper section, the lower section of the shielded facility must include an array of steel and concrete rods that will help prevent vandalism problems due to the design of the shielded facility and the thicknesses of the walls. In addition, the mix of materials and concrete will prevent water filtration.

All of the injection system components are located inside the lower section of the shielded facility: Chemical tank (9), chemical filter (10), calibrator (11), pump (12), manometer (13), flow gauge (15) and injection pipe (16). The tank and the pump are fixed to the floor by concrete structures, providing better protection against vandalism. Another element located in the lower section is the gas ventilation pipe (14) which runs all the way through to the upper section of the shielded facility right next to the solar panels. A convection activated ventilation system inside the bunker is provided by two horizontal layers of 5 to 10 cm cylindrical cavities one at the bottom and other at the top.

The injection system is solar powered, therefore the solar panels (2) must be placed at an angle determined by the latitude of the country or region where they are installed. The wiring of this system is installed inside the shielded facility, to prevent theft.

The solar panels could be installed as shown in FIG. 1A where the design of the roof is made in order to cover the solar panel from the view of third parties to prevent theft of this element. The FIG. 1B presents an option to prevent decrease in the efficiency of the solar panels by avoiding shadows that could be present due the position of sun.

To prevent the theft of the solar panels, they must be installed with an acrylic cover compliant with specific features, as mentioned in the claims section herein. Another security device, to prevent solar panel theft is the use of electric shutters (1) that are specifically designed for protection of solar panels.

What is claimed is:

1. A shielded facility for protecting a fluid inhibitor injection system, the facility comprising:
    a lower housing including a top, a bottom, and sidewalls cooperating to define a lower interior, wherein the top defines an access opening that includes a steel hatch, and the injection system is disposed within the lower interior;
    an upper housing including a roof, a bottom, and sidewalls cooperating to define an upper interior, wherein the upper housing is disposed on the lower housing and wherein the upper and lower housings are made of reinforced concrete;
    an access gate provided in one of the sidewalls of the upper housing for providing entry into the upper interior, the gate including an array of holes for unlocking the gate in order to access the shielded facility, wherein the access gate is at least 1.5 meters above the ground;
    solar panels disposed on the roof; and
    shutters disposed on the roof and actuatable between an open position and a closed position, wherein the shutters are arranged to cover over the solar panels providing protection from vandals when in the closed position.

2. The shielded facility of claim 1 wherein solar panels further include an acrylic cover.

3. The shielded facility of claim 1 wherein the shutters automatically open during the day and close at night.

4. The shielded facility of claim 1 further comprising a holes defined in the upper housing that are configured to exhausts gas and heat out of the lower interior or the upper interior.

5. The shielded facility of claim 1 wherein the solar panels are acrylic.

6. The shielded facility of claim 5 wherein the acrylic is configured to transmit at least 92% of sun light and to filter 80-90% of harmful UV light that has a wavelength of 250-400 nanometers.

* * * * *